(12) United States Patent
Azuma

(10) Patent No.: US 6,758,264 B2
(45) Date of Patent: Jul. 6, 2004

(54) HEAT SINK AND ITS MANUFACTURING METHOD

(75) Inventor: Masanobu Azuma, Tokuyama (JP)

(73) Assignee: Tokuyama Corporation (JP)

( * ) Notice: Subject to any disclaimer, the term of this patent is extended or adjusted under 35 U.S.C. 154(b) by 0 days.

(21) Appl. No.: 10/343,214

(22) PCT Filed: May 15, 2002

(86) PCT No.: PCT/JP02/04702

§ 371 (c)(1),
(2), (4) Date: Jan. 29, 2003

(87) PCT Pub. No.: WO02/099879

PCT Pub. Date: Dec. 12, 2002

(65) Prior Publication Data

US 2003/0159817 A1 Aug. 28, 2003

(30) Foreign Application Priority Data

May 30, 2001 (JP) ........................................ 2001-161882

(51) Int. Cl.⁷ ................................................ H05K 7/20
(52) U.S. Cl. .................................... 165/185; 29/890.03
(58) Field of Search ................................ 165/185, 905; 29/890.03

(56) References Cited

U.S. PATENT DOCUMENTS

| | | | |
|---|---|---|---|
| 4,849,290 A | * | 7/1989 | Fujimori et al. ............ 428/408 |
| 5,190,823 A | * | 3/1993 | Anthony et al. ............ 428/408 |
| 5,272,009 A | * | 12/1993 | Schachner et al. .......... 428/408 |
| 5,299,214 A | * | 3/1994 | Nakamura et al. ............ 372/36 |
| 5,571,603 A | * | 11/1996 | Utumi et al. ................ 428/212 |
| 6,165,616 A | * | 12/2000 | Lemelson et al. .......... 428/408 |
| 6,447,851 B1 | * | 9/2002 | Gruen et al. ................ 427/575 |

FOREIGN PATENT DOCUMENTS

| | | |
|---|---|---|
| JP | 61-240629 A | 10/1986 |
| JP | 62-254450 A | 11/1987 |
| JP | 5-013843 A | 1/1993 |
| JP | 07-300675 A | 11/1995 |
| JP | 7-316816 A | 12/1995 |

* cited by examiner

Primary Examiner—Allen Flanigan
(74) Attorney, Agent, or Firm—Webb Ziesenheim Logsdon Orkin & Hanson, P.C.

(57) ABSTRACT

A heat sink including a substrate of insulating ceramic and, superimposed on its upper surface, a diamond film for disposing an element thereon. The heat sink has excellent heat radiation characteristics and is stable during use. This heat sink is obtained by providing a substrate of ceramic containing aluminum nitride of high thermal conductivity as a principal component; forming on the substrate a bonding member layer, such as a silicon film which is capable of being bonded with the substrate and a diamond film; and forming a polycrystalline diamond film of high quality on the bonding member layer so that the polycrystalline diamond film is strongly bonded with the substrate via the bonding member layer interposed therebetween in accordance with, for example, the vapor phase method.

10 Claims, 3 Drawing Sheets

HEAT SINK AND ITS MANUFACTURING METHOD

BACKGROUND OF THE INVENTION

1. Technical Field

The present invention relates to a heat sink and a process for producing the same. More particularly, the present invention relates to a heat sink having such a laminate structure that a layer of diamond of high thermal conductivity is superimposed on a substrate of aluminum nitride of high thermal conductivity, and further relates to a process for producing the heat sink.

2. Description of the Prior Art

The processing capacity of electronic components is making striking enhancement in accordance with the increase of information density. Thus, currently a large amount of heat is emitted from each electronic component. Since maintaining constant temperature is desired for ensuring the stable functioning of electronic components, various improvements for cooling them have been proposed. It is common practice to, in practical use, mount electronic components tending to have high temperature on a heat radiating member, namely, a material capable of absorbing heat, or a device including such a material for thermally protecting a constituent element or a system known as a heat sink.

As materials having been in practical use in heat sinks for long, there can be mentioned metals and metal alloys of satisfactory thermal conductivity, such as Cu and Cu—W, and semiconductive or insulating ceramics of high thermal conductivity, such as SiC and AlN. However, as a result of integration of electronic components, the outgoing heat is increasing to such an extent that the cooling with the use of a heat sink based on these materials only encounters a limit. Consequently, a heat sink material based on diamond exhibiting the highest thermal conductivity (about 2000 W/mK) among the existent materials, has been developed as a new heat sink material for enhancing heat radiation characteristics. As such a heat sink which is now common, there can be mentioned a substrate of copper and, brazed thereto, a single crystal diamond in plate or film form, known as a submount. However, the heat radiation characteristics of this heat sink have not always been satisfactory because the single crystal diamond is so expensive that a heat sink of large configuration cannot be employed and because the brazing material becomes a resistor to heat conduction.

Therefore, forming of a polycrystalline diamond film on a substrate according to the vapor phase synthetic process has been tried. For example, Japanese Patent Laid-open Publication No. 5(1993)-13843 proposed a heat radiating member consisting of a substrate having a surface for mounting a semiconductor element thereon and, covering the mounting surface, a diamond layer synthesized by the vapor phase process. This heat radiating member is for the purpose of suppressing the deterioration of performance of semiconductor laser elements by generated heat, and obtained by directly forming a polycrystalline diamond layer of 10 to 500 µm thickness on a substrate in accordance with the microwave plasma CVD (Chemical Vapor Deposition) process. It would be feasible to use this heat radiating member as a submount by miniaturizing the same.

In the above heat sink, the most suitable material of substrate on which a polycrystalline diamond film is to be formed varies depending on the usage. Among various substrate materials, sintered aluminum nitride (AlN) is known as a material having not only insulating properties but also high thermal conductivity. The AlN substrate is especially useful when it is intended to form a circuit on a substrate. Specifically, when it is intended to form a polycrystalline diamond layer only on an area of substrate on which an element is to be mounted while forming a circuit on areas of substrate other than the area of substrate on which an element is to be mounted, an insulating material such as a ceramic is preferred as a substrate material from the viewpoint that additional formation of an insulating film is not needed. Moreover, a material of high thermal conductivity is desired for avoiding the drop of heat radiation efficiency, namely, maintaining high thermal conductivity with respect to the whole body of substrate. Therefore, the use of sintered aluminum nitride (AlN) as a substrate material having not only insulating properties but also high thermal conductivity is to be considered.

In this connection, in the use of a metal of high thermal conductivity as a substrate, it is possible to obtain a substrate having not only insulating properties but also high thermal conductivity by laminating the substrate with an insulating film of, for example, $SiO_2$ in accordance with the vapor deposition method or the like. However, this insulating film often poses a problem with respect to the reliability in voltage withstanding properties, etc.

It is anticipated that the above heat sink comprising a substrate of sintered aluminum nitride (AlN) and, superimposed thereon, a polycrystalline diamond layer will have high availability.

However, it is difficult to directly form a polycrystalline diamond layer of high quality on a substrate of sintered aluminum nitride (AlN) in accordance with the vapor phase synthetic process. From the practical viewpoint, any heat sink comprising a polycrystalline diamond layer of high thermal conductivity superimposed on a substrate of AlN is not known. For example, although the above Japanese Patent Laid-open Publication No. 5(1993)-13843 describes that Cu, Cu—W alloy, Cu—Mo alloy, Cu—W—Mo alloy, W, Mo, sintered SiC, sintered $Si_3N_4$, sintered AlN and the like can be used as substrate materials, the thermal conductivity of the polycrystalline diamond actually formed on a substrate of sintered AlN is as extremely low as 300 W/m·K.

It is an object of the present invention to provide a method of forming a polycrystalline diamond layer of high quality on a ceramic substrate containing aluminum nitride (AlN) as a principal component. It is another object of the present invention to provide a heat sink having such a fundamental structure that a polycrystalline diamond film is formed on the above substrate, and having excellent heat radiation characteristics.

SUMMARY OF THE INVENTION

The present inventor has found that a polycrystalline diamond film of high quality exhibiting high thermal conductivity can be produced on a ceramic substrate containing aluminum nitride as a principal component by preliminarily forming thereon a layer of specified substance exhibiting excellent adhesion to the substrate and a diamond film and thereafter forming a polycrystalline diamond film on the above layer in accordance with the vapor phase method.

Therefore, according to one aspect of the present invention, there is provided a heat sink comprising a ceramic substrate having at least one plane containing aluminum nitride as a principal component, and a diamond film layer superimposed on the plane of the ceramic substrate, characterized in that the ceramic substrate and the diamond film layer are bonded together via a bonding member interposed therebetween.

In the above heat sink of the present invention, a ceramic substrate containing, as a principal component, aluminum nitride which is excellent in insulating characteristics and heat radiation characteristics is used as a substrate material. Accordingly, the heat absorption performance and heat radiation performance of the heat sink as a whole are excellent. Further, in case of the heat sink having such a structure that the diamond film is formed so as not to cover the entire surface of the substrate, an electronic circuit made of a metal can be printed on the substrate without the particular need to form an insulating film.

In the heat sink of the present invention, it is preferred that the bonding member be constituted of at least one material selected from the group consisting of silicon, silicon carbide, tungsten, tungsten carbide, CuW, Cu—Mo alloy, Cu—Mo—W alloy, amorphous carbon, boron nitride, carbon nitride and titanium. In the use of this bonding member, cracking or other faults of the diamond film superimposed on the bonding member can be avoided, the heat radiation performance is enhanced, and the durability of the diamond film is prolonged.

This bonding member may be constituted of a crystalline substance orientated on a specified crystal face. In particular, it is preferred that the bonding member be constituted of a polycrystalline silicon preferentially orientated for crystal face (111), crystal face (220) or crystal face (400.) When the bonding member is constituted of a crystalline substance, the crystal grains of the polycrystalline diamond film formed on the bonding member would be enlarged and the crystallinity thereof would be high, so that the diamond film would have especially high thermal conductivity.

According to necessity, the polycrystalline silicon may contain a dopant. The addition of the dopant would enable enhancing the orientation of polycrystalline silicon and would also enable imparting electrical conductivity to the silicon film.

In the heat sink of the present invention, preferably, the diamond film layer exhibits a thermal conductivity of 800 W/mK or greater. The heat sink of the present invention attains enhanced thermal conductivity as compared with that of a heat sink wherein a diamond film layer is directly superimposed on a substrate.

According to another aspect of the present invention, there is provided a process for producing a heat sink, comprising the steps of providing a ceramic substrate having at least one plane containing aluminum nitride as a principal component; forming a bonding member layer on at least a portion of the plane of the ceramic substrate; and forming a diamond film on the bonding member layer.

In the above process of the present invention, peeling or cracking of the diamond film would not occur during the cooling step after the diamond film formation step wherein the substrate is maintained at 700 to 1100° C. Thus, a heat sink of high quality according to the present invention can be stably produced in high efficiency in the process of the present invention. In particular, when a layer of crystalline substance orientated for a specified crystal face is formed as the bonding member layer, a diamond film of large crystal grains and high crystallinity can be easily formed. Moreover, when a layer containing silicon as a principal component is formed as the bonding member layer, a diamond nucleation would be promoted, thereby enabling formation of a diamond film in higher efficiency. Furthermore, in the process wherein the bonding member layer is formed from a conductive substance, such as a polycrystalline silicon containing a dopant, and wherein, while a direct current voltage is applied to the bonding member layer, a thin diamond film is formed on the bonding member layer in accordance with microwave CVD or hot filament CVD method, it would be feasible to efficiently deposit an effective precursor for diamond film synthesis on the substrate surface, thereby easily forming a diamond film of high crystallinity, high orientation degree and high thermal conductivity.

DETAILED DESCRIPTION OF THE PREFERRED EMBODIMENTS

Figure 1:
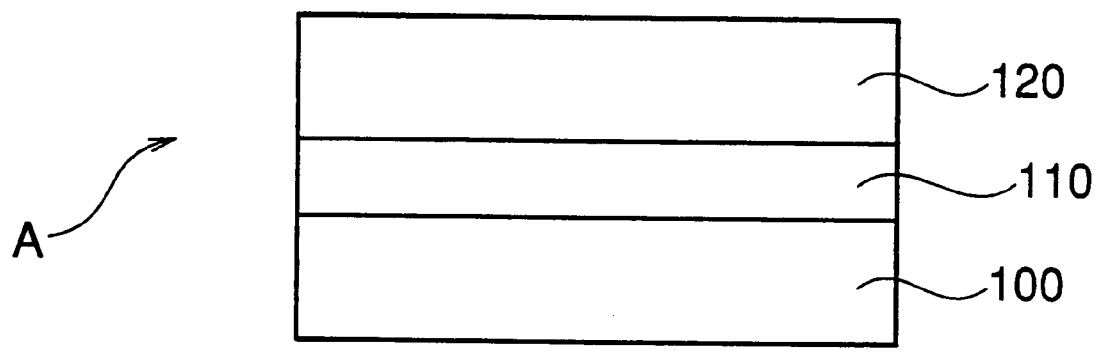
FIG. 1 is a sectional view of one representative form of heat sink according to the present invention.

The heat sink of the present invention is a laminate comprising a ceramic substrate having at least one plane containing aluminum nitride as a principal component, and, a diamond film layer superimposed on the plane of the ceramic substrate, characterized in that the ceramic substrate and the diamond film layer are bonded together via a bonding member interposed therebetween. The terminology "heat sink" used herein means a material capable of absorbing heat emitted by the aforementioned elements, or a device including such a material for thermally protecting a constituent element or a system. Thus, the terminology expresses a concept comprehending what is known as a submount.

In practical use, various elements such as a semiconductor element, a resistor and a capacitor are mounted on the diamond film.

The heat sink of the present invention includes a ceramic substrate containing, as a principal component, aluminum nitride which is a material exhibiting high thermal conductivity despite having insulating properties. Therefore, even in the formation of a laminate with the diamond film, the drop of total thermal conductivity can be suppressed. Further, when the diamond film is provided on not the entire surface of substrate but part of the surface of substrate, a circuit for wiring can be simply printed on the part where no diamond film is provided by the vapor deposition of a wiring material such as gold.

The above substrate for use in the present invention (hereinafter also referred to simply as "AlN substrate") is not particularly limited as long as it is constituted of a ceramic containing aluminum nitride as a principal component and as long as its configuration is one having at least one plane for formation of a diamond film on which an element is mounted. For example, the substrate may be a plate produced by adding a sintering auxiliary to aluminum nitride powder, shaping the mixture, for example, under pressure, and sintering thereof. Also, the substrate may be one obtained by molding a polycrystalline aluminum nitride to a plate form.

The above diamond film may be constituted of a polycrystal or a single crystal, and may be constituted of natural diamond or synthetic diamond. From the viewpoint of cost and easiness of film formation, however, it is preferred that the diamond film be constituted of a polycrystalline diamond synthesized by the vapor phase method. The area, configuration, thickness, etc. of the diamond film are appropriately determined depending on the mounted element, desired heat radiation characteristics, production time and production cost. Generally, the thicker the, diamond film, the greater the heat radiation. On the other hand, the thinner the diamond film, the less the production time and cost. Therefore, taking a balance of these into account, it is preferred that the thickness of the diamond film be in the range of 10 to 300 µm, especially 20 to 250 µm.

The higher the thermal conductivity of diamond film, the greater the advantage. In the employment of the production process of the present invention which will be described in detail later, hence, it is preferred to use a polycrystalline diamond film exhibiting a thermal conductivity of 800 W/mK or greater, especially 1000 W/mK or greater, in the heat sink of the present invention. In this connection, the diamond film is so thin that the thermal conductivity thereof cannot be directly measured. Therefore, the thermal conductivity of diamond film refers to a value calculated, after measuring of the thermal conductivity of a heat sink as a whole, from the thermal conductivity and thickness values of known materials constituting the substrate and the bonding member and the measured thermal conductivity of the heat sink as a whole.

The most characteristic feature of the heat sink according to the present invention resides in that the AlN substrate and the diamond film are bonded together via a bonding member layer interposed therebetween, wherein the bonding member has adherence to both the AlN substrate and the diamond film. The interposition of the bonding member layer enables producing a diamond film of high quality without the peeling or cracking of diamond thin film during the production process. Further, after the production process, it enables avoiding the breakage or peeling of diamond film by a heating/cooling cycle during the use thereof.

This bonding member layer is not particularly limited as long as it is a layer constituted of a material having desirable adherence to both the AlN substrate and the diamond film. However, from the viewpoint of high adhesive strength (or bonding strength) to both the AlN substrate and the diamond film, it is preferred that the bonding member layer be constituted of at least one material selected from the group consisting of silicon, silicon carbide, tungsten, tungsten carbide, CuW, Cu—Mo alloy, Cu—Mo—W alloy, amorphous carbon, boron nitride, carbon nitride and titanium.

When the bonding member is constituted of a crystalline substance orientated for a specified crystal face, the crystal grains of the polycrystalline diamond film formed on the top of the bonding member would be enlarged and the crystallinity thereof would be high, so that the thermal conductivity of the diamond film would be enhanced. Accordingly, it is preferred that the bonding member be constituted of such a crystalline material. Such a crystalline material can be, for example, a polycrystalline silicon preferentially orientated for crystal face (111), crystal face (220) or crystal face (400); or a polycrystalline silicon containing a dopant, such as boron or phosphorus, preferentially orientated for the above crystal face. The doped orientated polycrystalline silicon is especially preferred from the viewpoint that, because it is conductive, a direct current voltage can be applied at the forming of diamond film as described later.

Although the thickness of the bonding member layer is not particularly limited, it is preferred that the thickness be in the range of 5 nm to 3 µm, especially 10 nm to 2 µm, from the viewpoint of a balance of bonding effect, effect on easiness in obtaining a diamond film of high quality, time taken in the formation of bonding member layer, drop of thermal conductivity by providing of the bonding member layer, etc.

FIG. 1 is a representative sectional view of heat sink "A" according to the present invention. The heat sink "A" has such a structure that aluminum nitride substrate 100 in plate form is laminated with bonding member 110 and diamond film 120 in this order. Although FIG. 1 shows the form of heat sink wherein the entire upper surface of the aluminum nitride substrate 100 is covered by the bonding member 110 and the diamond film 120, it is not always needed for the bonding member layer to adhere to the entire lower surface of the diamond film as the upper layer, and it is satisfactory that partial adherence be effected, as long as satisfactory bonding strength can be realized.

The process for producing a heat sink according to the present invention is not particularly limited. For example, the heat sink can be appropriately produced by forming the bonding member layer on at least a portion of the plane of the AlN substrate and forming the diamond film on the bonding member layer so that the diamond film covers at least a portion of the bonding member layer. With respect to the bonding member layer formed in this production process, it is not particularly limited as long as the formation is effected so that part or the entirety thereof is finally interposed between the AlN substrate and the diamond film. The formation of the bonding member layer may be effected in the configuration of a film having an area larger than that of the diamond film, or a film having an area smaller than that of the diamond film. Moreover, the film-like configuration is not always needed. For example, the bonding member layer may be in the form of a lattice, or a plurality of spots scattered at given intervals therebetween. It is preferred that the thickness of the bonding member layer be in the range of 5 nm to 3 µm from the viewpoint of a balance between attained effects and productivity.

In the formation of the bonding member layer, suitable methods according to the material of the bonding member layer is appropriately selected from among the common film forming methods known as being useful in the formation of films on substrates without limitation. Examples of such film forming methods include printing, plating, vapor deposition, chemical vapor deposition (CVD), sputtering and laser abrasion methods. Of these, the vapor deposition and chemical vapor deposition methods enable forming a film of high purity with high film thickness precision, thus providing especially effective means.

For example, the bonding member layer constituted of at least one material selected from the group consisting of silicon, silicon carbide, W, WC, CuW, Cu—Mo alloy, Cu—Mo—W alloy, titanium and BN can be appropriately formed by the vacuum vapor deposition method with the use of electron beams. In this method, a material consisting of the same type of substance as that constituting the bonding member layer is placed on a hearth in a vacuum chamber. This material is exposed to electron beams, so that the material is melted and vaporized. The vapor of the material is deposited (vapor deposited) on a surface of substrate disposed in the vacuum chamber. Thus, the formation of the bonding member layer is accomplished. At this stage, the thickness of deposited film can be accurately controlled by measuring the thickness of substance deposited in film by means of a film thickness monitor using a quartz oscillator. At the vapor deposition, the temperature of substrate may be equal to room temperature, or the substrate may be heated.

When the bonding member layer can be formed by the CVD method from a gaseous material of, for example, silicon, amorphous carbon, carbon nitride, titanium, silicon carbide or W, it is appropriate to employ the CVD method. The formation of bonding member layer according to the chemical vapor deposition method can be appropriately performed by the use of parallel plate plasma CVD apparatus. In this method, a raw gas such as $SiH_4$ diluted with a diluent gas such as hydrogen gas according to necessity is introduced in a reaction vessel evacuated to vacuum. Radiofrequency power is applied to one of a pair of parallel plate electrodes arranged opposite to each other, thereby generating radiofrequency gas plasma. Thus, a film of silicon, amorphous carbon, carbon nitride, titanium, silicon carbide or W can be formed on a substrate disposed on the other electrode opposite to the above electrode. The substrate is generally heated to about 50 to 500° C. although varied depending on film growing conditions. Measuring of the film forming speed for each forming condition in advance would enable accurate estimation of a film thickness by controlling a film formation time. As the diluent gas, use can be made of nondeposited gas such as helium, nitrogen, argon, xenon, neon or krypton as well as hydrogen gas.

The shape of the bonding member layer can be arbitrarily varied by etching after film formation or by masking the substrate at the time of film formation.

In the production process of the present invention, the formation of the bonding member layer is not only important for preventing the peeling or cracking of the diamond film layer formed on the bonding member layer but also extremely important for enhancing the product quality of the diamond film formed.

Therefore, in one preferred mode of the present invention, the bonding member layer is constituted of a crystalline substance orientated for a specified crystal face. The formation of the bonding member layer from the crystalline substance orientated for a specified crystal face would enable maintaining the orientation of the sublayer at the time of forming a polycrystalline diamond film thereon in accordance with the vapor phase method, thereby attaining growth of a polycrystalline diamond film of high orientation. As a result the diamond film of high crystallinity can be obtained.

In another preferred mode of the present invention, the bonding member layer may be formed from a conductive substance. When the bonding member layer is formed from a conductive substance, the bonding member layer is used as an electrode, and a direct current voltage is applied to the bonding member layer at the time of forming the diamond film in accordance with the vapor phase method. Consequently, an effective precursor for diamond synthesis would be preferentially deposited on the bonding member layer, thereby enabling formation of a polycrystalline diamond film of large crystal grains with high crystallinity. The crystallinity increase and crystal grain enlargement of polycrystalline diamond film would enhance the thermal conductivity of the diamond film. As a result, a heat sink which is excellent in heat radiation characteristics can be obtained.

Although the method of forming the bonding member layer from the crystalline substance orientated for a specified crystal face is not particularly limited, when it is intended to form the bonding member layer whose principal component is silicon in accordance with the CVD method, the orientation of silicon film can be controlled by regulating forming conditions. Thus, such a polycrystalline silicon film that diffraction peak assigned to crystal face (111), (220) or (400) preferentially appears when an X-ray diffractometry is conducted can be formed. For example, when it is intended to obtain a silicon film preferentially orientated on face (111) (when an X-ray diffractometry is conducted, the diffraction peak strength assigned to this face is significantly greater than those assigned to other faces), film formation is appropriately performed at high forming operation temperatures. When it is intended to obtain a silicon film preferentially orientated on face (220) film formation is appropriately performed under high reaction pressures. When it is intended to obtain a silicon film preferentially orientated on face (400), film formation is appropriately performed under such conditions that a silane halide gas and a silane hydride gas are mixed together at an appropriate ratio. At this stage, a mixture of reactive gas with a gasifiable compound containing a dopant element selected from among the elements belonging to Group III or Group V of the periodic table, such as diborane or phosphine, can be subjected to film synthesis to thereby enable synthesizing a conductive silicon film of P type or N type. When the bonding member layer is constituted of such a silicon film, both the above orientation effect and voltage application effect can be exerted. Therefore, it is optimal to form, as the bonding member layer, a polycrystalline silicon film containing a dopant (namely, of P type or N type) which realizes preferential appearance of crystal face (111), (220) or (400) when an X-ray diffractometry is conducted.

In the production process of the present invention, the thus formed bonding member layer is overlaid with the diamond film. As aforementioned, although the area, configuration, thickness, etc. of formed diamond film can appropriately be determined depending on the mounted element, desired heat radiation characteristics, production time and production cost, it is preferred that the thickness of the diamond film be in the range of 10 to 300 $\mu$m, especially 20 to 250 $\mu$m.

Although the method of forming the diamond film is not particularly limited, it is preferred that film formation be effected in accordance with the vapor phase method from the viewpoint that intended film formation can be accomplished easily. As the vapor phase method, common vapor phase methods suitable for diamond film formation, such as chemical vapor deposition and laser abrasion methods, can be employed without limitation. Of these, the chemical vapor deposition method is most appropriate since, among the current technologies, it can provide means for stably producing a highly crystalline diamond film with high reproducibility. The chemical vapor deposition method can be classified into techniques respectively utilizing radiofrequency wave, microwave, a hot filament, etc., according to production process characteristics. Of these, the technique utilizing microwave (microwave CVD method) and the technique utilizing a hot filament (hot filament CVD method) are preferred. These productive techniques will be described below.

In these productive techniques, carbonaceous gasifiable substances including methane, acetylene, carbon dioxide and carbon monoxide are generally used as the raw material of diamond film. These deposited gases may be diluted with a nondeposited gas of, for example, hydrogen, oxygen, nitrogen, argon, xenon, neon or krypton.

Also, a gasifiable compound containing an element belonging to Group III or Group V of the periodic table, such as diborane or phosphine, can be mixed with the above gases before diamond synthesis. When a diamond film synthesis is carried out in the presence of such gases, a conductive diamond film of P type or N type can be synthesized.

The substrate temperature during the formation of diamond film, although not particularly limited, is preferably in the range of 600 to 1200° C., still preferably 700 to 1100° C. When the substrate temperature is lower than 600° C., a diamond film containing amorphous carbon in high proportion would be formed, so that the thermal conductivity would be low, thereby disenabling satisfactory exertion of the effects of the present invention. On the other hand, when the substrate temperature exceeds 1200° C., the bonding member layer may suffer damages. Further, amorphous carbon maybe contained in the diamond like the phenomenon occurring in the low temperature film formation. Therefore, the substrate temperature exceeding 1200° C. is unfavorable. Any method of heating the substrate can be employed without particular limitation as long as the temperature can be set for the above ranges. For example, there can be mentioned a heating method wherein a heater is buried in a holder provided for mounting the substrate; a method wherein the substrate is heated by radiofrequency induction heating; and a method wherein, in the microwave plasma CVD method, the substrate is heated by microwave inputted for plasma generation. The pressure for diamond synthesis is generally in the range of 0.1 mTorr to 300 Torr. In particular, in the microwave plasma CVD method, the pressure is in the range of 50 mTorr to 200 Torr. Further, in the microwave plasma CVD method, the output of plasma generation power source, although appropriately selected depending on the characteristics of formed diamond film, is generally in the range of 300 W to 10 kW. The shape of diamond film can be arbitrarily varied by etching after film formation or by masking the substrate at the time of film formation.

Figure 2:
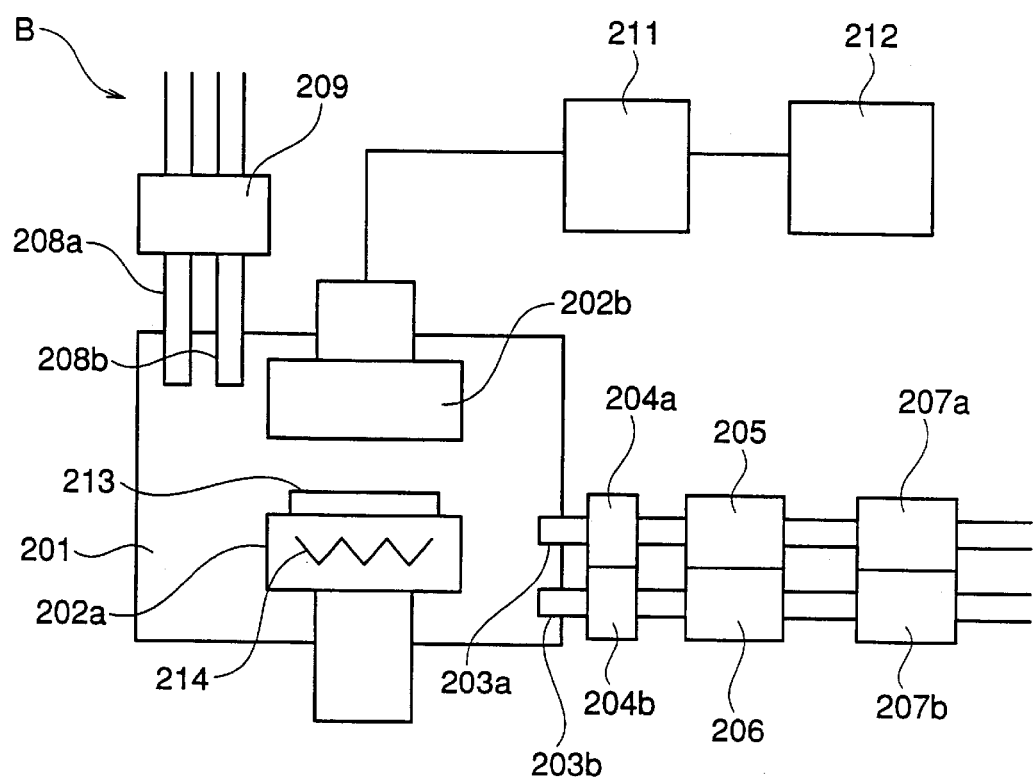
FIG. 2 is a schematic view of radiofrequency plasma CVD apparatus which can be appropriately used in the formation of a silicon film as a bonding member layer in the production process of the present invention.
Figure 3:
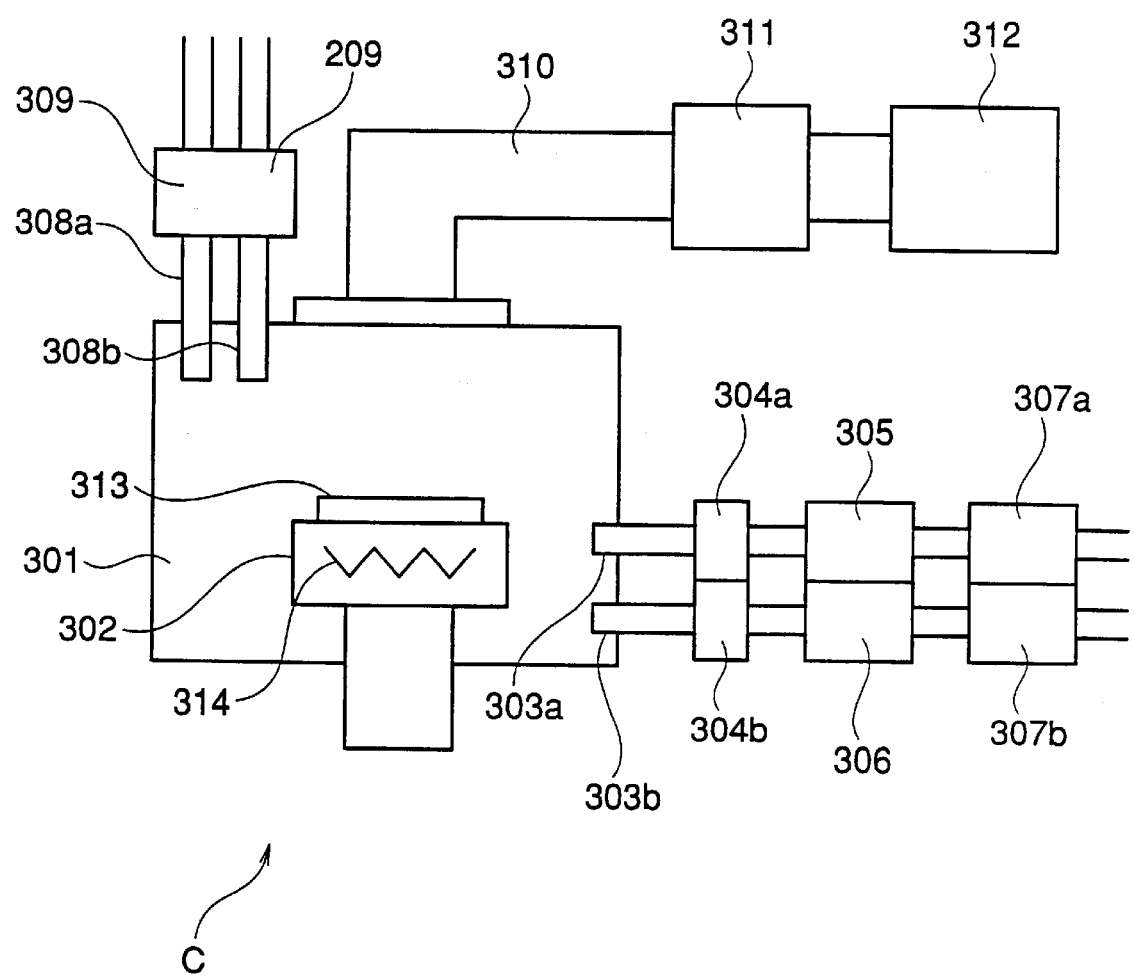
FIG. 3 is a schematic view of microwave CVD apparatus which can be appropriately used in the formation of a diamond film in the production process of the present invention

With respect to the process for producing the heat sink "A" of the present invention as shown in FIG. 1 wherein the bonding member layer is constituted of silicon, particular modes thereof wherein use is made of parallel plate type radiofrequency plasma CVD apparatus "B" as shown in FIG. 2 and also microwave plasma CVD apparatus "C" as shown in FIG. 3 will be described in greater detail below.

The apparatus "B" of FIG. 2 is a representative apparatus which can appropriately be used in the formation of bonding member layer 110. The apparatus "B" includes reaction vessel 201 constituted of, for example, a stainless steel such as SUS 304, wherein vacuum is maintained. The reaction vessel 201 is connected through exhaust ports 203a, 203b, which are provided in a side wall of reaction chamber, to a vacuum source such as a vacuum pump, so that given vacuum is maintained in the reaction vessel 201. In FIG. 2, numerals 205 and 207a denote a turbo molecular pump and an oil rotary pump, respectively. High vacuum can be attained in the reaction vessel by exhausting by means of these pumps. Numeral 206 denotes a mechanical booster pump, and numeral 207b denotes an oil rotary pump. These pumps are used at the time of synthesizing a silicon film. Further, vacuum valves 204a, 204b for regulating the exhaust rate are disposed. Still further, sample table 202a for mounting substrate 213 is disposed inside the reaction vessel 201 of the apparatus "B". Heater 214 for heating the substrate 213 is buried in this sample table so that there is provided means for enabling control of the substrate temperature. This sample table is provided so as to pass through a bottom wall of the reaction vessel 201 and is so constructed as to be vertically slidable by drive means not shown, thereby permitting position adjustment. Slide portion, not shown, between the sample table 202a and the bottom wall of reaction vessel 201 is fitted with a sealing or seal member for ensuring desired vacuum level in the reaction vessel 201. Radiofrequency application electrode 202b is disposed opposite to the sample table 202a for mounting the substrate, so that radiofrequency wave from radiofrequency oscillator 212 can be led into the reaction vessel 201 via tuning unit 211. Further, reactive gas supply ports 208a, 208b are disposed at an upper portion of the reaction vessel 201, so that gases can be introduced into the reaction vessel 201 via reactive gas flow rate regulator 209. Radiofrequency gas plasma is generated between the parallel plate electrodes (202a–202b) of the reaction vessel 201 by simultaneously carrying out feeding of reactive gas and application of radiofrequency wave, so that the reactive gas can be dissociated to thereby form the silicon film on the substrate 213.

The apparatus "C" of FIG. 3 is a representative apparatus which can appropriately be used in the formation of diamond film 120. The apparatus "C" includes reaction vessel 301 constituted of, for example, a stainless steel such as SUS 304, wherein vacuum is maintained. The reaction vessel 301 is connected through exhaust ports 303a, 303b, which are provided in a side wall of reaction chamber, to a vacuum source such as a vacuum pump, so that given vacuum is maintained in the reaction vessel 301. In FIG. 3, numerals 305 and 307a denote a turbo molecular pump and an oil rotary pump, respectively. High vacuum can be attained in the reaction vessel 301 by exhausting by means of these pumps. Numeral 306 denotes a mechanical booster pump, and numeral 307b denotes an oil rotary pump. These pumps are used at the time of synthesizing a diamond film. Further, vacuum valves 304a, 304b for regulating the exhaust rate are disposed. Still further, sample table 302 for mounting substrate 313 is disposed inside the reaction vessel 301 of the apparatus "C". Heater 314 for heating the substrate 313 is buried in this sample table so that there is provided means for enabling control of the substrate temperature. This sample table is provided so as to pass through a bottom wall of the reaction vessel 301 and is so constructed as to be vertically slidable by drive means not shown, thereby permitting position adjustment. Slide portion, not shown, between the sample table 302 and the bottom wall of reaction vessel 301 is fitted with a sealing or seal member for ensuring desired vacuum level in the reaction vessel 301. Microwave transmission window 315 constituted of a dielectric substance, such as quartz or alumina, is disposed at an upper portion of the reaction vessel 301, so that microwave from microwave oscillator 312 can be led through tuning unit 311 and propagated through a microwave guide tube into the reaction vessel 301. Further, reactive gas supply ports 308a, 308b are disposed at an upper portion of the reaction vessel 301, so that gases can be introduced into the reaction vessel 301 via reactive gas flow rate regulator 309. Microwave gas plasma is generated above the substrate mounting table of the reaction vessel 301 by simultaneously carrying out feeding of reactive gas and application of microwave, so that the reactive gas can be dissociated to thereby form the diamond film on the substrate 313. At this stage, the diamond film can be formed while applying a voltage to the silicon film as the bonding member layer.

When it is intended to produce the heat sink "A" of the present invention, first, substrate 213 is set on substrate mounting part 202a inside the apparatus "B". The interior of reaction vessel 201 is exhausted to create vacuum. After exhausting until a vacuum of $5 \times 10^{-6}$ Torr or below is realized in the reaction vessel 201, not only is gas whose flow rate has been regulated by the reactive gas flow rate regulator fed through the reactive gas supply ports into the reaction vessel 201, but also radiofrequency wave from the radiofrequency oscillator 212 provided outside the reaction vessel 201 is transmitted through tuner 211 to thereby minimize reflection loss and inputted to the radiofrequency application electrode 202b. Consequently, radiofrequency gas plasma is generated, so that a silicon film is formed on the substrate 213. The formation of silicon film is carried out while the pressure inside the reaction vessel 201 is preferably in the range of 0.1 mTorr to 100 Torr, still preferably 50 mTorr to 50 Torr. Under this pressure, a uniform and homogeneous silicon film of high crystallinity can be efficiently formed. In the production process of the present invention, the substrate temperature during the formation of silicon film, although not particularly limited, is preferably in the range of 50 to 500° C., still preferably 80 to 350° C. In the radiofrequency plasma CVD method, although the output of plasma generation power source is appropriately selected depending on the characteristics of formed silicon film, it is generally in the range of 5 W to 2 kW. The radiofrequency oscillation frequency is preferably in the range of 1 to 200 MHz, still preferably 5 to 150 MHz. However, these conditions depend on the capacity and morphology of apparatus used in the above synthesis and should not be determined generally.

Gasifiable substances containing silicon, such as $SiH_4$, $Si_2H_6$, $SiHCl_3$, $SiH_2Cl_2$, $SiCl_4$, $SiF_4$ and $SiF_2H_2$, are generally used as the reactive gas for deposition to be introduced in the reaction vessel 201. These deposited gases may be diluted with a nondeposited gas of, for example, hydrogen, nitrogen, helium, argon, xenon, neon or krypton.

Also, a gasifiable compound containing an element belonging to Group III or Group V of the periodic table, such as diborane or phosphine, can be mixed with the above gases before the synthesis of silicon film. When the synthesis of silicon film is carried out in the presence of such gases, a conductive silicon film of P type or N type can be synthesized.

Although the introduction rates of reactive gas and diluent gas are varied depending on production conditions, when it is intended to obtain a film of high crystallinity, it is generally preferred that the gases be introduced so that the total introduction rate falls within the range of 50 to 1000 cc/min. Further, although the ratio of reactive gas and diluent gas mixed is not particularly limited, the greater the mixing ratio of diluent gas to reactive gas (diluent gas/ reactive gas), the greater the tendency to formation of a silicon film of high crystallinity. Also, the orientation of silicon film can be controlled by regulating the film formation temperature, reaction pressure and raw gas mixing ratio.

After the formation of the silicon film as the bonding member layer, the resultant substrate is taken out from the reaction vessel 201 and set on substrate mounting table 302 inside the apparatus "C" for diamond film formation. In the same manner as in the formation of the bonding member layer, the interior of reaction vessel 301 is exhausted by a vacuum pump to create vacuum. In the same manner as in the formation of the bonding member layer, after exhausting until a pressure of $5 \times 10^{-6}$ Torr or below is realized in the reaction vessel 301, not only is gas whose flow rate has been regulated by the reactive gas flow rate regulator fed through the reactive gas supply ports into the reaction vessel 301, but also microwave from the microwave power source 312 provided outside the reaction vessel 301 is transmitted through tuner 311 to thereby minimize reflection loss, led through the microwave guide tube 310 and inputted into the reaction vessel 301. Consequently, microwave gas plasma is generated above the substrate mounting table 302, so that a diamond film is formed on the substrate 313 having already been provided with the bonding member. At the stage of diamond film formation, application of a direct current voltage to the silicon film as the bonding member layer for about an hour from the initial stage of film growth is especially effective in the forming of a diamond film of high crystallinity. The applied voltage is preferably in the range of +500 V to −500 V. The formation of diamond film is carried out while the pressure inside the reaction vessel 301 is preferably in the range of 0.1 mTorr to 300 Torr, still preferably 50 mTorr to 200 Torr. Under this pressure, a uniform and homogeneous diamond film of high crystallinity can be efficiently formed. In the production process of the present invention, the substrate temperature during the formation of diamond film, although not particularly limited, is preferably in the range of 600 to 1200° C., still preferably 700 to 1100° C. In the microwave plasma CVD method, although the output of plasma generation power source is appropriately selected depending on the characteristics of formed diamond film, it is generally in the range of 300 W to 10 kW. The microwave oscillation frequency is preferably in the range of 500 MHz to 5 GHz, still preferably 1 GHz to 4 GHz. However, these conditions depend on the capacity and morphology of apparatus used in the above synthesis and should not be determined generally.

Carbonaceous gasifiable substances such as methane, acetylene, carbon dioxide and carbon monoxide are generally used as the reactive gas to be introduced in the reaction vessel 301. These deposited gases may be diluted with a nondeposited gas of, for example, hydrogen, nitrogen, helium, argon, xenon, neon, krypton or oxygen.

Also, a gasifiable compound containing an element belonging to Group III or Group V of the periodic table, such as diborane or phosphine, can be mixed with the above gases before the synthesis of diamond film. When the synthesis of diamond film is carried out in the presence of such gases, a conductive diamond film of P type or N type can be synthesized.

Although the introduction rates of reactive gas and diluent gas are varied depending on production conditions, when it is intended to obtain a diamond film of high thermal conductivity, it is generally preferred that the gases be introduced so that the total introduction rate falls within the range of 50 to 6000 cc/min. Further, although the ratio of reactive gas and diluent gas mixed is not particularly limited, the greater the mixing ratio of diluent gas to reactive gas (diluent gas/reactive gas), the greater the tendency to formation of a diamond film of high crystallinity.

EXAMPLE

The present invention will be further illustrated below with reference to the following Examples, which, however, in no way limit the scope of the invention.

In the following Examples and Comparative Examples, each silicon film was formed with the use of apparatus of the structure shown in FIG. 2, and each diamond film was formed with the use of apparatus of the structure shown in FIG. 3. Moreover, in each of the following Examples and Comparative Examples, the bonding member layer, diamond film and finally obtained heat sink were evaluated according to the following methods (1) to (4).

(1) Measurement of Film Thickness

In the measuring of the thickness of bonding member layer, in advance, a silicon or tungsten film is formed on a quartz substrate, and the film thickness is measured with the use of a tracer type film thickness meter. The measured thickness is divided by production time, thereby determining the film forming rate beforehand. The thickness of particular bonding member layer was calculated by multiplying the film forming rate by the time taken in the formation of the particular bonding member layer. On the other hand, the thickness of diamond film was determined by observing a section configuration through a scanning electron microscope.

(2) Orientation

The orientation of silicon film and diamond film was inspected by an X-ray diffractometry. With respect to the silicon film, the peaks assigned to faces (111), (220), (311) and (400) appear at 28.4° (2θ/°), 47.3° (2θ/°), 56.1° (2θ/°) and 69.1° (2θ/°), respectively. On the other hand, with respect to the diamond film, the peaks assigned to faces (111), (220), (311) and (400) appear at 43.95° (2θ/°), 75.40° (2θ/°), 91.60° (2θ/°) and 119.7° (2θ/°), respectively. Accordingly, the orientations were evaluated by comparing the intensities thereof with each other.

(3) Crystallinity

The crystallinity was evaluated by measuring the half-value width of scattered waveform appearing at about 1333 $cm^{-1}$ in Raman scattering spectroscopy. The smaller the half-value width or Full Width Half Maximum (FWHM), the higher the crystallinity.

(4) Thermal Conductivity

The thermal conductivity was calculated by the formula:

$$\text{thermal conductivity (W/mK)} = \text{density (g/cm}^3) \times \text{specific heat (J/gK)} \times \text{thermal diffusivity (cm}^2/\text{s)} \times 100 \text{ (constant)}.$$

Herein, the density was measured by the underwater density measuring method, and the thermal diffusivity was determined by the nonlinear regression analysis according to the 2-dimensional ring method.

Example 1

Ceramic substrate (25 mm×25 mm×0.5 mm thickness) containing aluminum nitride as a principal component was set on the substrate mounting table inside the radio frequency plasma CVD apparatus. The interior of the reaction vessel was exhausted to vacuum, and simultaneously the substrate mounting table was heated to 120° C. The apparatus was held undisturbed for about 30 min until the substrate temperature was stabilized, and the reduction of pressure within the reaction vessel to $5\times10^{-6}$ Torr or below was confirmed. Monosilane gas and hydrogen were introduced in the reaction vessel at respective flow rates of 3 cc/min and 100 cc/min, and the internal pressure of the reaction vessel was set for 1.5 Torr by regulating the exhaust valve. Subsequently, radiofrequency wave from the radiofrequency power source at an output of 50 W was tuned by the tuner so as to minimize reflection loss and inputted to the radiofrequency application electrode. Radiofrequency power was applied for about 2000 sec so that the silicon film of 100 nm thickness was deposited on the substrate. After the completion of deposition reaction, the residual gas inside the reaction vessel was drawn off, and, after the confirmation of the lowering of substrate temperature to 100° C. or below, the reaction vessel was opened to expose the same to the atmosphere. Then, the substrate overlaid with the silicon film was taken out from the radiofrequency plasma CVD apparatus. The orientation of the formed silicon film was inspected, and no result of strong orientation on a specified face was recognized. Further, the thermal conductivity of the substrate having the silicon film deposited thereon was measured. The measurement showed that the thermal conductivity was about 200 W/mK.

Thereafter, in order to superimpose the diamond film, the obtained substrate was set on the substrate mounting table inside the microwave plasma CVD apparatus. The interior of the reaction vessel was exhausted to vacuum, and simultaneously the substrate mounting table was heated to 1000° C. The apparatus was held undisturbed for about 1 hr until the substrate temperature was stabilized, and the reduction of pressure within the reaction vessel to $5\times10^{-6}$ Torr or below was confirmed. Methane gas and hydrogen were introduced in the reaction vessel at respective flow rates of 12 cc/min and 300 cc/min, and the internal pressure of the reaction vessel was set for 100 Torr by regulating the exhaust valve. Subsequently, microwave from the microwave power source at an output of 5 kW was tuned by the tuner so as to minimize reflection loss, led through the window constituted of quartz and introduced in the reaction vessel. Microwave power was applied for about 10 hr so that the diamond film of 50 μm thickness was deposited on the substrate. After the completion of deposition reaction, the lowering of substrate temperature to 100° C. or below was confirmed, and thereafter the reaction vessel was opened to expose the same to the atmosphere. Then, the substrate overlaid with the silicon film and the diamond film was taken out from the microwave plasma CVD apparatus. The diamond film on the substrate was visually inspected, and it was found that formation of the diamond film extended to edges of the substrate and that there was no film peeling. A section of the diamond film was observed through a microscope, and the thickness of the diamond film was measured. It was found that the thickness was about 50 μm. Thereafter, the crystallinity of the diamond on the substrate was estimated by Raman scattering spectroscopy. As a result, it was found that the FWHM of peak assigned to diamond structure, appearing at about 1333 $cm^{-1}$, was about 8.5 $cm^{-1}$. Further, the orientation of the diamond layer was inspected, and, as found with respect to the bonding member layer, no result of strong orientation on a specified face was recognized. Still further, the thermal conductivity of the obtained laminate (heat sink) was measured. The measurement showed that the thermal conductivity was about 350 W/mK. Calculation from the thermal conductivity values showed that the thermal conductivity of the diamond film was 1850 W/mK.

Example 2

Heat sink was produced in the same manner as in Example 1 except that the thickness of synthesized diamond film was 200 μm. The diamond film on the substrate was visually inspected, and it was found that formation of the diamond film extended to edges of the substrate and that there was no film peeling. A section of the diamond film was observed through a microscope, and the thickness of the diamond film was measured. It was found that the thickness was about 200 μm. Thereafter, the crystallinity of the diamond on the substrate was inspected in the same manner as in Example 1. As a result, it was found that the FWHM was about 6.8 $cm^{-1}$. Further, the orientation of the obtained diamond layer was inspected, and no result of strong orientation on a specified face was recognized. Still further, the thermal conductivity of the obtained heat sink was measured. The measurement showed that the thermal conductivity after lamination with the diamond film was about 720 W/mK while that after lamination with the bonding member layer was about 200 W/mK. Calculation from these values showed that the thermal conductivity of the diamond film was 2000 W/mK.

Example 3

Heat sink was produced in the same manner as in Example 1 except that the bonding member layer was constituted of W. The diamond film on the substrate was visually inspected, and it was found that formation of the diamond film extended to edges of the substrate and that there was no film peeling. A section of the diamond film was observed through a microscope, and the thickness of the diamond film was measured. It was found that the thickness was about 50 μm. Thereafter, the crystallinity of the diamond on the substrate was inspected. As a result, it was found that the FWHM was about 8.0 cm$^{-1}$. Further, the orientation of the obtained diamond layer was inspected, and no result of strong orientation on a specified face was recognized. Still further, the thermal conductivity of the obtained heat sink was measured. The measurement showed that the thermal conductivity after lamination with the diamond film was about 360 W/mK while that after lamination with the bonding member layer was about 210 W/mK. Calculation from these values showed that the thermal conductivity of the diamond film was 1860 W/mK.

Comparative Example 1

Heat sink was produced in the same manner as in Example 1 except that no bonding member layer was formed. The diamond film on the substrate was visually inspected, and film peeling was found in the vicinity of substrate edges.

Comparative Example 2

The same procedure for producing a heat sink as in Example 3 was repeated except that the material of the bonding member layer was changed to nickel. However, a uniform diamond film of desired thickness could not be obtained. This showed that nickel was unsuitable to the bonding member.

Example 4

Silicon film of 100 nm thickness was deposited on the substrate in the same manner as in Example 1 except that the substrate mounting table was heated to 300° C. and that the output of radiofrequency power source was 10 W. The orientation of obtained silicon film was inspected in the same manner as in Example 1. It was found that the silicon film had orientation of (111). Further, the thermal conductivity of the substrate having the silicon film deposited thereon was inspected. It was found that the thermal conductivity was about 200 W/mK.

Thereafter, a diamond film of 50 μm thickness was formed on the above substrate having the silicon film deposited thereon in the same manner as in Example 1. Thus, a heat sink was obtained. The crystallinity of the diamond on the substrate was inspected. As a result, it was found that the FWHM was about 7.9 cm$^{-1}$. Further, the orientation of the obtained diamond layer was inspected, and realization of such a result that diffraction peak assigned to face (111) was larger than the other peaks by about 2.5 times was recognized. Still further, the thermal conductivity of the obtained heat sink was measured. The thermal conductivity was about 370 W/mK. Calculation from the thermal conductivity values showed that the thermal conductivity of the diamond film was 2070 W/mK.

Example 5

Heat sink was produced in the same manner as in Example 4 except that, with respect to the conditions for forming the silicon film, the substrate was heated to 120° C. Various evaluations of the heat sink were effected. As a result, it was found that, with respect to the crystallinity of the diamond on the substrate, the FWHM was about 7.7 cm$^{-1}$. Further, with respect to both the silicon film and the diamond film, realization of such a result that diffraction peak assigned to face (220) was larger than the other peaks by about 4 times was recognized. Still further, the thermal conductivity values of the substrate having the silicon film deposited thereon and the finally obtained heat sink were 200 W/mK and 380 W/mK, respectively. Calculation from these thermal conductivity values showed that the thermal conductivity of the diamond film was 2180 W/mK.

Example 6

Heat sink was produced under the same conditions as in Example 5 except that diborane was fed at a flow rate of 5 cc/min at the stage of forming the bonding member layer and that a direct current voltage of −100 V was applied to the bonding member layer for 30 min in the initial stage of diamond film formation. Various evaluations of the heat sink were effected. As a result, it was found that, with respect to the crystallinity of the diamond on the substrate, the FWHM was about 7.3 cm$^{-1}$. Further, with respect to both the silicon film and the diamond film, realization of such a result that diffraction peak assigned to face (220) was larger than the other peaks by about 4 times was recognized. Still further, the thermal conductivity values of the substrate having the silicon film deposited thereon and the finally obtained heat sink were 200 W/mK and 400 W/mK, respectively. Calculation from these thermal conductivity values showed that the thermal conductivity of the diamond film was 2400 W/mK.

The heat sink of the present invention exhibits high heat radiation efficiency by virtue of the use of a ceramic substrate constituted mainly of aluminum nitride of high thermal conductivity (AlN substrate) as a substrate on which a diamond film is formed. Further, the substrate is an insulator, so that it is practicable to cover part of the substrate with a diamond film while a circuit is formed on the other part of the substrate. Still further, in the heat sink of the present invention, the substrate and the diamond film are bonded together with satisfactory strength, so that, even if a heating/cooling heat cycle is repeated during the use thereof, the diamond film would not suffer peeling or cracking. Therefore, the heat sink can be stably used for a prolonged period of time.

Moreover, the production process of the present invention enables efficiently producing the above heat sink of the present invention. Further, whilst the prior art of forming a diamond film directly on the AlN substrate in accordance with the vapor phase method has failed to form a diamond film of high quality, the production process of the present invention enables forming a diamond film of high quality on the AlN substrate, although indirectly, by virtue of the interposition of a bonding member layer of specified substance.

What is claimed is:

1. A heat sink comprising a ceramic substrate having at least one plane containing aluminum nitride as a principal component, and, a diamond film layer superimposed on the plane of the ceramic substrate, characterized in that the ceramic substrate and the diamond film layer are bonded together via a bonding member which is constituted of a crystalline substance orientated for a specified crystal face interposed therebetween.

2. The heat sink as claimed in claim 1, wherein the bonding member is constituted of at least one material selected from the group consisting of silicon, silicon carbide, tungsten, tungsten carbide, CuW, Cu—Mo alloy, Cu—Mo—W alloy, amorphous carbon, boron nitride, carbon nitride and titanium.

3. The heat sink as claimed in claim 1, wherein the bonding member is constituted of a polycrystalline silicon orientated for crystal face (111), crystal face (220) or crystal face (400).

4. The heat sink as claimed in claim 3, wherein the polycrystalline silicon contains a dopant.

5. The heat sink as claimed in claim 1, wherein the diamond film layer exhibits a thermal conductivity of 800 W/mK or greater.

6. A process for producing a heat sink, comprising the steps of:

provide a ceramic substrate having at least one plane containing aluminum nitride as a principal component, forming a bonding member layer which is constituted of a crystalline substance orientated for a specified crystal face on at least a portion of the plane of the ceramic substrate, and forming a diamond film on the bonding member layer.

7. The process as claimed in claim 6, wherein the bonding member layer is formed from a conductive substance, and, while a direct current voltage is applied to the bonding member layer, a thin diamond film is formed on the bonding member layer in accordance with microwave CVD or hot filament CVD method.

8. The heat sink as claimed in claim 2, wherein the diamond film layer exhibits a thermal conductivity of 800 W/mK or greater.

9. The heat sink as claimed in claim 3, wherein the diamond film layer exhibits a thermal conductivity of 800 W/mK or greater.

10. The heat sink as claimed in claim 4, wherein the diamond film layer exhibits a thermal conductivity of 800 W/mK or greater.

* * * * *